(12) United States Patent
Jun et al.

(10) Patent No.: US 8,437,206 B2
(45) Date of Patent: May 7, 2013

(54) LATENCY CIRCUIT AND SEMICONDUCTOR DEVICE COMPRISING SAME

(75) Inventors: In-Woo Jun, Hwaseong-si (KR); Byung Hoon Jeong, Hwaseong-si (KR); Min Soo Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 295 days.

(21) Appl. No.: 12/857,762

(22) Filed: Aug. 17, 2010

(65) Prior Publication Data
US 2011/0085394 A1  Apr. 14, 2011

(30) Foreign Application Priority Data
Oct. 14, 2009  (KR) .......................... 10-2009-0097851

(51) Int. Cl.
*G11C 7/00* (2006.01)
(52) U.S. Cl.
USPC ... 365/194; 365/193; 365/233.1; 365/233.11; 365/233.12
(58) Field of Classification Search ................ 365/193, 365/194, 233.1, 233.11, 233.12
See application file for complete search history.

(56) References Cited

U.S. PATENT DOCUMENTS

| | | | | |
|---|---|---|---|---|
| 6,388,945 | B2 * | 5/2002 | Aikawa ..................... | 365/233.11 |
| 6,426,900 | B1 * | 7/2002 | Maruyama et al. ........... | 365/194 |
| 6,480,946 | B1 * | 11/2002 | Tomishima et al. .......... | 711/167 |
| 6,552,955 | B1 * | 4/2003 | Miki ........................... | 365/233.1 |
| 6,717,887 | B1 * | 4/2004 | Kono et al. ............... | 365/189.14 |
| 6,826,115 | B2 * | 11/2004 | Lee et al. .................... | 365/238.5 |
| 6,987,705 | B2 * | 1/2006 | Kim et al. .................... | 365/154 |
| 7,027,336 | B2 * | 4/2006 | Lee ................................ | 365/194 |
| 7,065,003 | B2 * | 6/2006 | Lee et al. ..................... | 365/194 |
| 7,103,126 | B2 * | 9/2006 | Joo et al. ....................... | 375/354 |
| 7,170,819 | B2 | 1/2007 | Szczypinski | |
| 7,345,942 | B2 * | 3/2008 | Matsuzaki ..................... | 365/222 |
| 7,345,950 | B2 * | 3/2008 | Fujisawa et al. .......... | 365/233.12 |
| 7,420,871 | B2 * | 9/2008 | Chu .......................... | 365/233.1 |
| 7,457,191 | B2 * | 11/2008 | Lee .......................... | 365/233.12 |
| 7,554,878 | B2 * | 6/2009 | Kim .............................. | 365/232 |
| 7,570,542 | B2 * | 8/2009 | Lee ........................... | 365/233.1 |
| 7,660,171 | B2 * | 2/2010 | Jang .............................. | 365/194 |
| 7,675,797 | B2 * | 3/2010 | Jeong et al. ................... | 365/193 |
| 7,706,210 | B2 * | 4/2010 | Kim et al. ................... | 365/233.1 |
| 7,773,435 | B2 * | 8/2010 | Cho .............................. | 365/194 |
| 7,826,305 | B2 * | 11/2010 | Fujisawa .................... | 365/233.1 |
| 7,843,743 | B2 * | 11/2010 | Bae .......................... | 365/189.15 |

(Continued)

FOREIGN PATENT DOCUMENTS

| | | |
|---|---|---|
| KR | 1020060115657 A | 11/2006 |
| KR | 1020070027126 A | 3/2007 |
| KR | 100791001 B1 | 12/2007 |

*Primary Examiner* — Viet Q Nguyen
(74) *Attorney, Agent, or Firm* — Volentine & Whitt, PLLC

(57) ABSTRACT

A latency circuit comprises a latency control block, an internal read command generator, and a latency signal generation unit. The latency control block generates a plurality of first control clocks by delaying a delay sync signal generated based on an external clock, and generates a second control clock having a margin with respect to a read command decoded based on the delay sync signal. The internal read command generator samples the second control clock using the decoded read command and generates an internal read command based on a sampled second control clock. The latency signal generation unit generates a latency signal based on a shifting operation performed on the internal read command using the plurality of first control clocks.

11 Claims, 10 Drawing Sheets

U.S. PATENT DOCUMENTS

| | | | |
|---|---|---|---|
| 7,869,288 B2 * | 1/2011 | Lee | 365/194 |
| 7,969,802 B2 * | 6/2011 | Lee | 365/194 |
| 8,040,752 B2 * | 10/2011 | Fujisawa | 365/233.1 |
| 8,045,406 B2 * | 10/2011 | Kwon et al. | 365/191 |
| 8,208,340 B2 * | 6/2012 | Fujisawa | 365/233.1 |
| 2007/0047340 A1 | 3/2007 | Kim | |
| 2008/0101140 A1 | 5/2008 | Jeong et al. | |
| 2010/0244915 A1 * | 9/2010 | Kwon et al. | 327/158 |

* cited by examiner

LATENCY CIRCUIT AND SEMICONDUCTOR DEVICE COMPRISING SAME

CROSS-REFERENCE TO RELATED APPLICATIONS

This application claims priority under 35 U.S.C. §119 to Korean Patent Application No. 10-2009-0097851 filed on Oct. 14, 2009, the disclosure of which is hereby incorporated by reference in its entirety.

BACKGROUND

Embodiments of the inventive concept relate generally to semiconductor devices and latency circuits for the semiconductor devices. More particularly, embodiments of the inventive concept relate to semiconductor devices and latency circuits adapted to provide stable latency in spite of frequency changes of an external clock and process-voltage-temperature (PVT) variations.

In synchronous semiconductor devices, data is input and output in synchronization with an external clock. For instance, in a read operation, a synchronous semiconductor device receives a read command in synchronization with an external clock and outputs corresponding read data in synchronization with the external clock.

The time required for a synchronous semiconductor device to perform a certain action in response to an external command is referred to as latency. For instance, in a read operation, latency can indicate an amount of time between receipt of a read command and production of read data. In a synchronous semiconductor device, such latency is commonly measured in clock cycles of the external clock.

A latency signal can be used to indicate the latency of particular operations, such as read operations. Accordingly, the latency signal can be used, for instance, to indicate the availability of data after a read operation is performed.

In certain conventional devices, a latency signal is generated by latching an internal read command using a control signal. Where the frequency of an external clock increases, a margin between the internal read command signal and the control signal decreases. As a result, domain skew between the control signal (a delayed clock domain signal) and the internal read command (an external clock domain signal), which can be sensitive to changes in PVT, can produce instability in the latency signal.

SUMMARY

Embodiments of the inventive concept provide a latency circuit that can generate a stable latency signal during a high frequency operation and under different PVT conditions. Embodiments of the inventive concept also provide semiconductor devices incorporating the latency circuit.

According to an embodiment of the inventive concept, a latency circuit comprises a latency control block, an internal read command generator, and a latency signal generation unit. The latency control block generates a plurality of first control clocks by delaying a delay sync signal generated based on an external clock, and generates a second control clock having a predetermined margin with respect to a read command decoded based on the delay sync signal. The internal read command generator samples the second control clock using the decoded read command and generates an internal read command based on a sampled second control clock. The latency signal generation unit generates a latency signal based on a shifting operation performed on the internal read command using the plurality of first control clocks.

In certain embodiments, the latency control block generates the second control clock by delaying the delay sync signal using a first replica corresponding to a data output path and a second replica corresponding to a path through which the decoded read command is generated.

In certain embodiments, the latency control block comprises a first replica and a second replica, and a clock delay block. The first replica receives the delay sync signal and generates a third clock in synchronization with the external clock by delaying the delay sync signal by a delay corresponding to a data output path. The second replica receives the third clock and generates the second control clock by delaying the third clock based on a phase difference between the external clock and the decoded read command. The clock delay block receives the delay sync signal and generates the plurality of first control clocks by delaying the delay sync signal. In certain embodiments, the second replica delays the third clock for an interval equal to a difference between a phase difference between the external clock and the decoded read command and a sampling setup time of the second control clock of the internal read command generator.

In certain embodiments, the internal read command generator comprises a sampling block that samples the second control clock based on the decoded read command, a command delay block that generates a plurality of delayed read commands by delaying the decoded read command, and a logical operation block that generates the internal read command by performing a logical operation on the sampled second control clock and the plurality of delayed read commands.

In certain embodiments, the latency signal generation unit comprises a shift register unit that performs a shifting operation on the internal read command based on the plurality of first control clocks, and a latency control unit that selectively performs an additional shifting operation on a signal output from the shift register unit based on a latency setting value.

In certain embodiments, the latency signal indicates availability of data output in response to the read command.

In certain embodiments, the read command is used to read data in a random access memory.

According to another embodiment of the inventive concept, a latency circuit comprises a latency control block, an internal read command generator, and a latency signal generation unit. The latency control block generates a plurality of even first control clocks, a plurality of odd first control clocks, and a second control clock using a plurality of divided signals each having a period twice as long as a period of an external clock. The internal read command generator generates an even internal read command and an odd internal read command based on a sampling operation on the second control clock using a decoded read command. The latency signal generation unit generates a latency signal based on a shifting operation on the even internal read command and the odd internal read command using the plurality of even first control clocks and the plurality of odd first control clocks.

In certain embodiments, the latency control block comprises a clock divider that generates an even divided signal and an odd divided signal by dividing a delay sync signal generated based on the external clock, a first replica that generates a third clock in synchronization with the external clock by delaying the even divided signal or the odd divided signal by a delay of a data output path, and a second replica that receives the third clock and generates the second control clock by delaying the third clock based on a phase difference between the external clock and the decoded read command, and a sampling setup time of the internal read command generator.

In certain embodiments, the latency control block further comprises a clock delay block that receives the even divided signal and the odd divided signal and generates the plurality of even first control clocks and the plurality of odd first control clocks by delaying the even divided signal and the odd divided signal.

In certain embodiments, the internal read command generator comprises a sampling block that samples the second control clock and an inverted second control clock based on the decoded read command, a command delay block that generates a plurality of delayed read commands by delaying the decoded read command, and a logical operation block that generates the even internal read command and the odd internal read command by performing a logical operation on the sampled second control clock and the plurality of delayed read commands.

In certain embodiments, the latency signal generation unit comprises a shift register unit that shifts the even internal read command using the plurality of even first control clocks and shifts the odd internal read command using the plurality of odd first control clocks, a latency control unit that selectively performs an additional shifting operation on signals output from the shift register unit based on a latency setting value, and a logical device that outputs one of the shifted even internal read command and the shifted odd internal read command as the latency signal.

In certain embodiments, the second replica delays the third clock for an interval equal to a difference between a phase difference between the external clock and the decoded read command and a sampling setup time of the second control clock of the internal read command generator.

In certain embodiments, the latency signal indicates availability of data output in response to the read command.

According to still another embodiment of the inventive concept, a semiconductor memory device comprises a memory cell array comprising a plurality of memory cells, a data output buffer that receives output data from the memory cell array, and a latency circuit that generates a latency signal for the data output buffer. The latency circuit comprises a latency control block, an internal read command generator, and a latency signal generation unit. The latency control block generates a plurality of first control clocks by delaying a delay sync signal generated based on an external clock, and generates a second control clock having a predetermined margin with respect to a read command decoded based on the delay sync signal. The internal read command generator samples the second control clock using the decoded read command and generates an internal read command based on a sampled second control clock. The latency signal generation unit generates a latency signal based on a shifting operation performed on the internal read command using the plurality of first control clocks.

In certain embodiments, the memory cell array forms part of a random access memory.

In certain embodiments, the memory cell array and the latency circuit are packaged in a semiconductor package having a configuration selected from a package on package configuration, ball grid array configuration, and a chip scale package configuration.

In certain embodiments, the latency control block generates the second control clock by delaying the delay sync signal using a first replica corresponding to a data output path and a second replica corresponding to a path through which the decoded read command is generated.

In certain embodiments, the latency signal generation unit comprises a shift register unit that performs a shifting operation on the internal read command based on the plurality of first control clocks, and a latency control unit that selectively performs an additional shifting operation on a signal output from the shift register unit based on a latency setting value.

BRIEF DESCRIPTION OF THE DRAWINGS

The drawings illustrate various embodiments of the inventive concept. In the drawings, like reference numbers denote like features.

DETAILED DESCRIPTION OF THE EMBODIMENTS

Selected embodiments of the inventive concept are described below with reference to the accompanying drawings. These embodiments are presented as teaching examples and should not be construed to limit the scope of the inventive concept.

In the description that follows, where an element is referred to as being "connected" or "coupled" to another element, it can be directly connected or coupled to the other element or intervening elements may be present. In contrast, where an element is referred to as being "directly connected" or "directly coupled" to another element, there are no intervening elements present. As used herein, the term "and/or" includes any and all combinations of one or more of the associated listed items and may be abbreviated as "/".

The terms first, second, etc. are used herein to describe various elements, but these elements should not be limited by these terms. Rather, these terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," or "includes" and/or "including", where used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which the inventive concept belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 1:
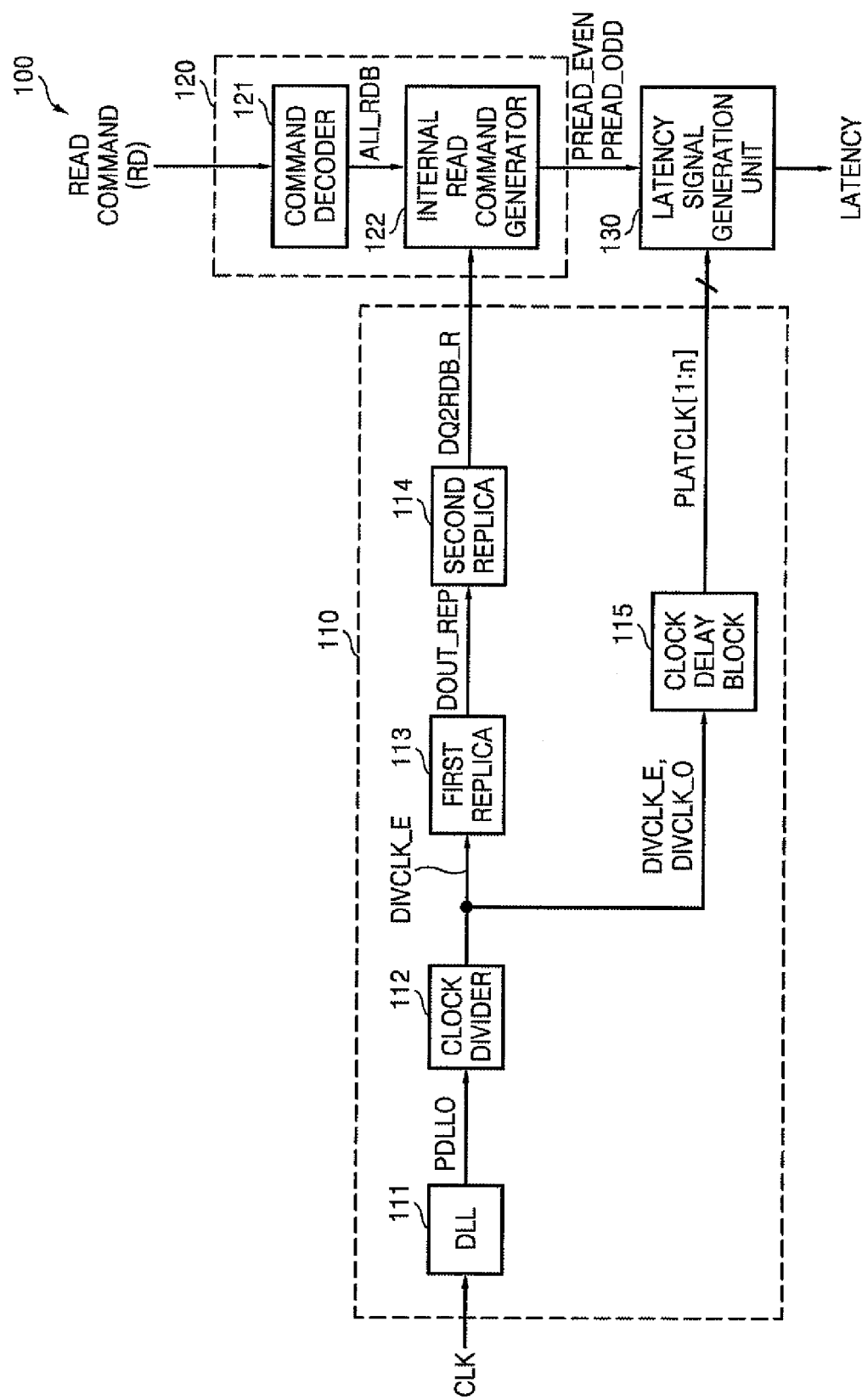
FIG. 1 is a block diagram of a latency circuit according to an embodiment of the inventive concept.

FIG. 1 is a block diagram of a latency circuit according to an embodiment of the inventive concept. Referring to FIG. 1, latency circuit 100 comprises a latency control block 110, an internal read command generation unit 120, and a latency signal generation unit 130.

Latency control block 110 generates a plurality of first control clocks PLATCLK[1:n] by delaying a delay sync signal PDLLO that is generated based on an external clock CLK. Latency control block 110 also generates a second control clock DQ2RDB_R having a predetermined margin with respect to a read command ALI_RDB that is decoded based on delay sync signal PDLLO. Latency control block 110 generates a plurality of first even control clocks PLATCLK[1:n]_E, a plurality of first odd control clocks PLATCLK[1:n]_O, and second control clock DQ2RDB_R, using divided signals each having a period twice as long as external clock CLK.

Latency control block 110 comprises a delay sync loop (DLL) 111, a clock divider 112, a first replica 113, a second replica 114, and a clock delay block 115. Delay sync loop 111 receives external clock CLK and outputs a delay sync signal PDLLO. Clock divider 112 receives and divides delay sync signal PDLLO to generate even and odd divided signals DIVCLK_E and DIVCLK_O having opposite phases.

Latency control block 110 generates second control clock DQ2RDB_R by delaying delay sync signal PDLLO using a replica for each of a data output path and generation path of a decoded read command ALI_RDB. First replica 113 is a replica for the data output path, and second replica 114 is a replica for the decoded read command generation path.

First replica 113 receives delay sync signal PDLLO, and generates a third clock DOUT_REP in synchronization with external clock CLK by delaying delay sync signal PDLLO according to a delay of the data output path. In some embodiments, first replica 113 generates third clock DOUT_REP in synchronization with external clock CLK by delaying even divided signal DIVCLK_E or odd divided signal DIVCLK_O according to the delay of the data output path. In the embodiment of FIG. 1, first replica 113 generates third clock DOUT_REP based on even divided signal DIVCLK_E.

Second replica 114 receives third clock DOUT_REP, and generates second control clock DQ2RDB_R by delaying third clock DOUT_REP based on a phase difference between external clock CLK and decoded read command ALI_RDB. For example, second replica 114 can delay third clock DOUT_REP for an interval obtained by subtracting a sampling setup time used by internal read command generator 122 to sample second control clock DQ2RDB_R, from a phase difference between external clock CLK and decoded read command ALI_RDB. The above operation is based on the sampling setup time of internal read command generator 122 because internal read command generator 122 samples second control clock DQ2RDB_R based on the timing of decoded read command ALI_RDB.

Clock delay block 115 receives delay sync signal PDLLO, and generates first control clocks PLATCLK[1:n] by delaying delay sync signal PDLLO. Also, clock delay block 115, as illustrated in FIG. 1, can receive even divided signal DIVCLK_E and odd divided signal DIVCLK_O, and generate first control clocks PLATCLK[1:n] by delaying the received even divided signal DIVCLK_E and odd divided signal DIVCLK_O. Although not shown in FIG. 1, first control clocks PLATCLK[1:n] comprise a plurality of first even control clocks PLATCLK[1:n]_E and a plurality of first odd control clocks PLATCLK[1:n]_O.

Internal read command generation unit 120 generates internal read commands PREAD_EVEN and PREAD_ODD based on a read command RD and second control clock DQ2RDB_R. Internal read command generation unit 120 comprises a command decoder 121 and internal read command generator 122. Command decoder 121 receives read command RD and generates decoded read command ALI_RDB by decoding read command RD.

Internal read command generator 122 samples second control clock DQ2RDB_R using decoded read command ALI_RDB, and generates internal read commands PREAD_EVEN and PREAD_ODD based on the sampled second control clock DQ2RDB_R. For example, internal read command generator 122 can generate even internal read command PREAD_EVEN and odd internal read command PREAD_ODD based on the sampling operation of second control clock DQ2RDB_R using decoded read command ALI_RDB.

Figure 2:
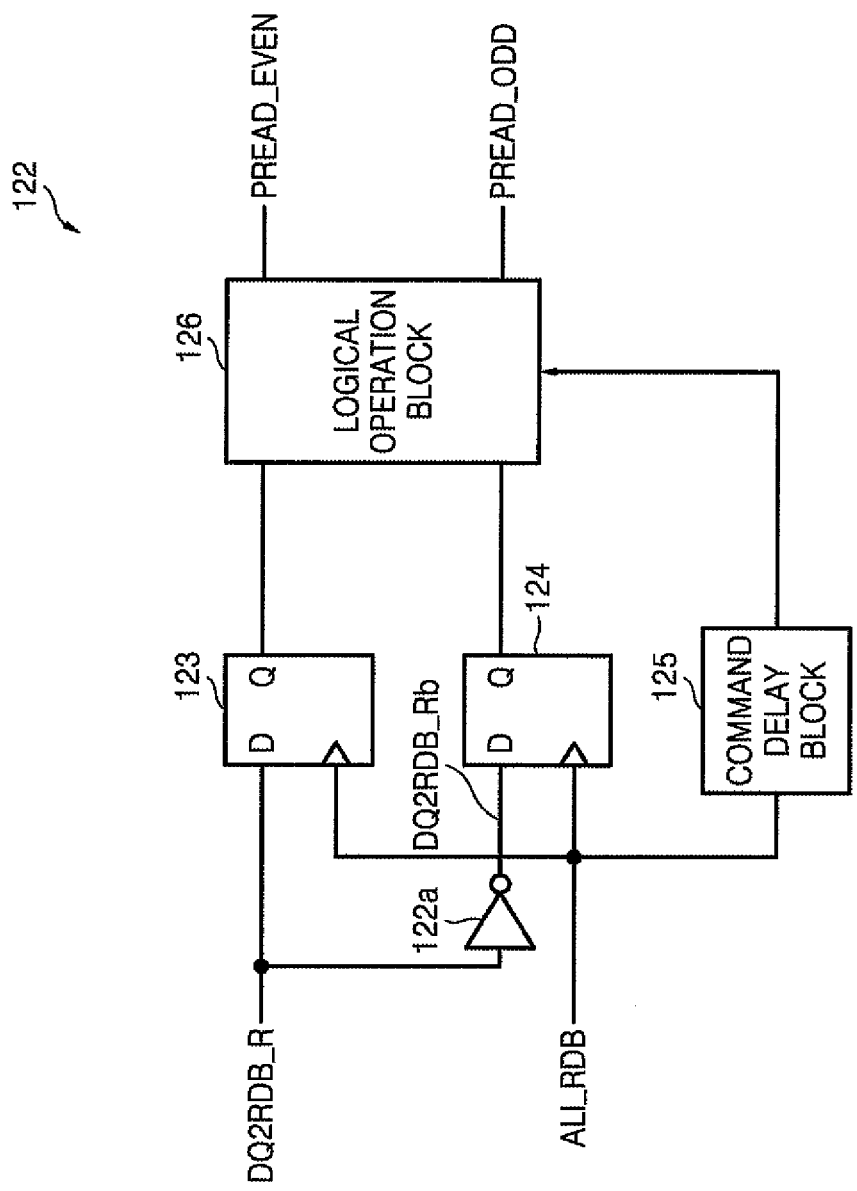
FIG. 2 is a circuit diagram of an example of an internal read command generator in the latency circuit of FIG. 1.

FIG. 2 is a circuit diagram of an internal read command generator of latency circuit 100 of FIG. 1. Referring to FIG. 2, internal read command generator 122 comprises sampling blocks 123 and 124, a command delay block 125, and a logical operation block 126.

Sampling blocks 123 and 124 sample second control clock DQ2RDB_R based on decoded read command ALI_RDB. For example, sampling blocks 123 and 124 sample second control clock DQ2RDB_R and a second control clock DQ2RDB_Rb that is inverted by an inverter 122a based on decoded read command ALI_RDB. Command delay block 125 generates a plurality of delayed read commands by delaying decoded read command ALI_RDB.

Logical operation block 126 generates internal read commands PREAD_EVEN and PREAD_ODD by performing a logical operation on the sampled second control clock and the delayed read command. For example, logical operation block 126 can generate even internal read command PREAD_EVEN and odd internal read command PREAD_ODD by performing a logical operation on the sampled second control clock and the delayed read command.

Latency signal generation unit 130 generates a latency signal LATENCY based on a shifting operation performed on internal read commands PREAD_EVEN and PREAD_ODD using first control clocks PLATCLK[1:n].

Figure 3:
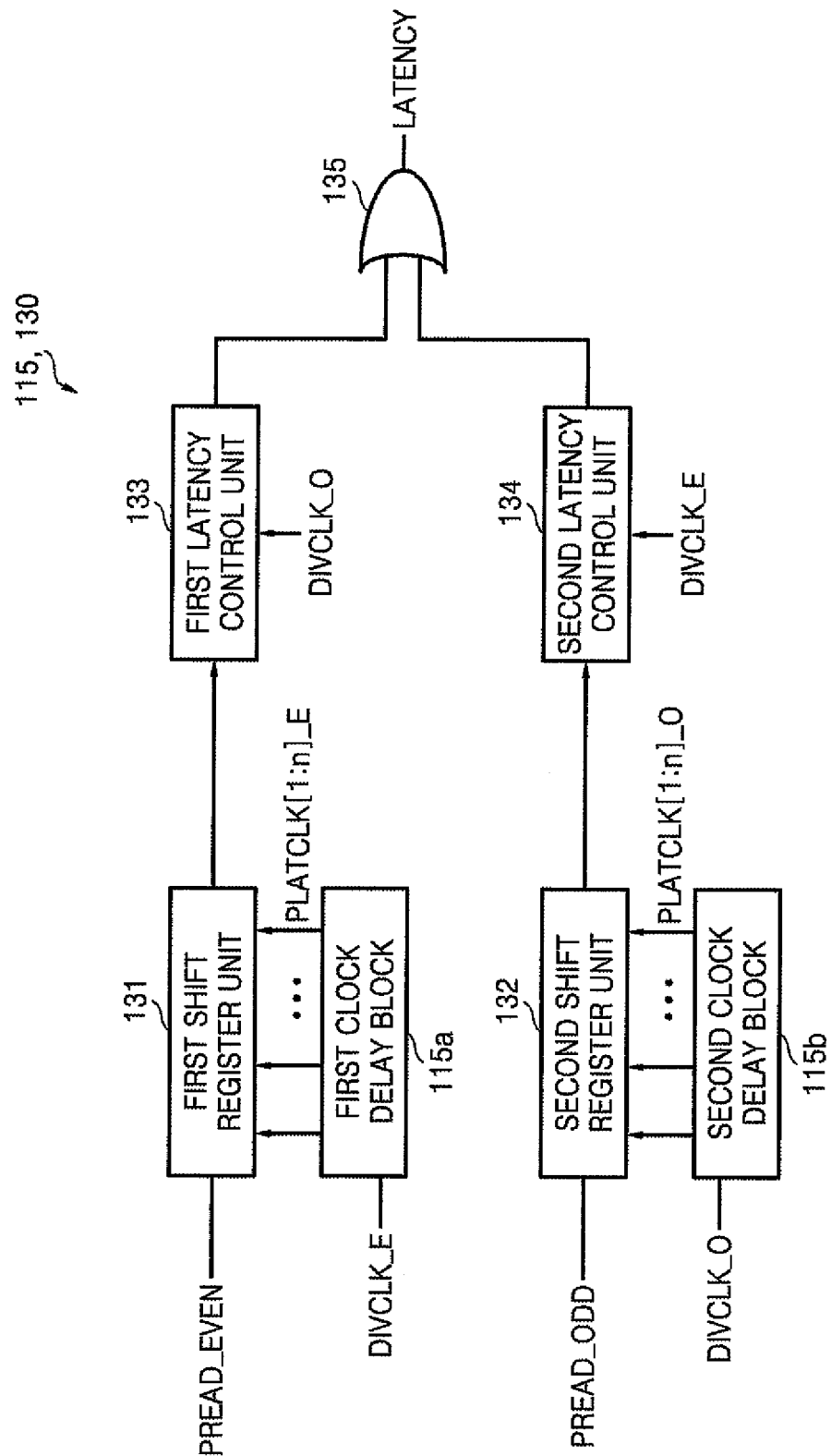
FIG. 3 is a circuit diagram of an example of a clock delay block and a latency signal generation unit in the latency circuit of FIG. 1.

FIG. 3 is a circuit diagram illustrating an example of clock delay block 115 and latency signal generation unit 130 of latency circuit 100. Referring to FIG. 3, clock delay block 115 comprises a first clock delay block 115a and a second clock delay block 115b. Clock delay blocks 115a and 115b receive delay sync signal PDLLO or divided signals DIVCLK_E and DIVCLK_O, and generate first control clocks PLATCLK[1:n] by delaying delay sync signal PDLLO or divided signals DIVCLK_E and DIVCLK_O. More specifically, first clock delay block 115a generates first even control clocks PLATCLK[1:n]_E by delaying even divided signal DIVCLK_E, and second clock delay block 115*b* generates first odd control clocks PLATCLK[1:n]_O by delaying odd divided signal DIVCLK_O.

Latency signal generation unit 130 comprises a first shift register unit 131, a second shift register unit 132, a first latency control unit 133, a second latency control unit 134, and a logical device 135. Shift register units 131 and 132 perform a shifting operation on internal read commands PREAD_EVEN and PREAD_ODD based on first control clocks PLATCLK[1:n]. First shift register unit 131 shifts and outputs even internal read command PREAD_EVEN by using first even control clocks PLATCLK[1:n]_E. Second shift register unit 132 shifts and outputs odd internal read command PREAD_ODD by using first odd control clocks PLATCLK[1:n]_O.

Latency control units 133 and 134 selectively perform an additional shifting operation on the signals output from shift register units 131 and 132 based on a latency set value. First latency control unit 133 selectively performs an additional shifting operation on the signal output from first shift register unit 131 in response to odd divided signal DIVCLK_O, and second latency control unit 134 selectively performs an additional shifting operation on the signal output from second shift register unit 132 in response to even divided signal DIVCLK_E.

Logical device 135 outputs one of the shifted internal even read command and the shifted internal odd read command as latency signal LATENCY. In this example, logical device 135 comprises an OR gate.

Figure 4:
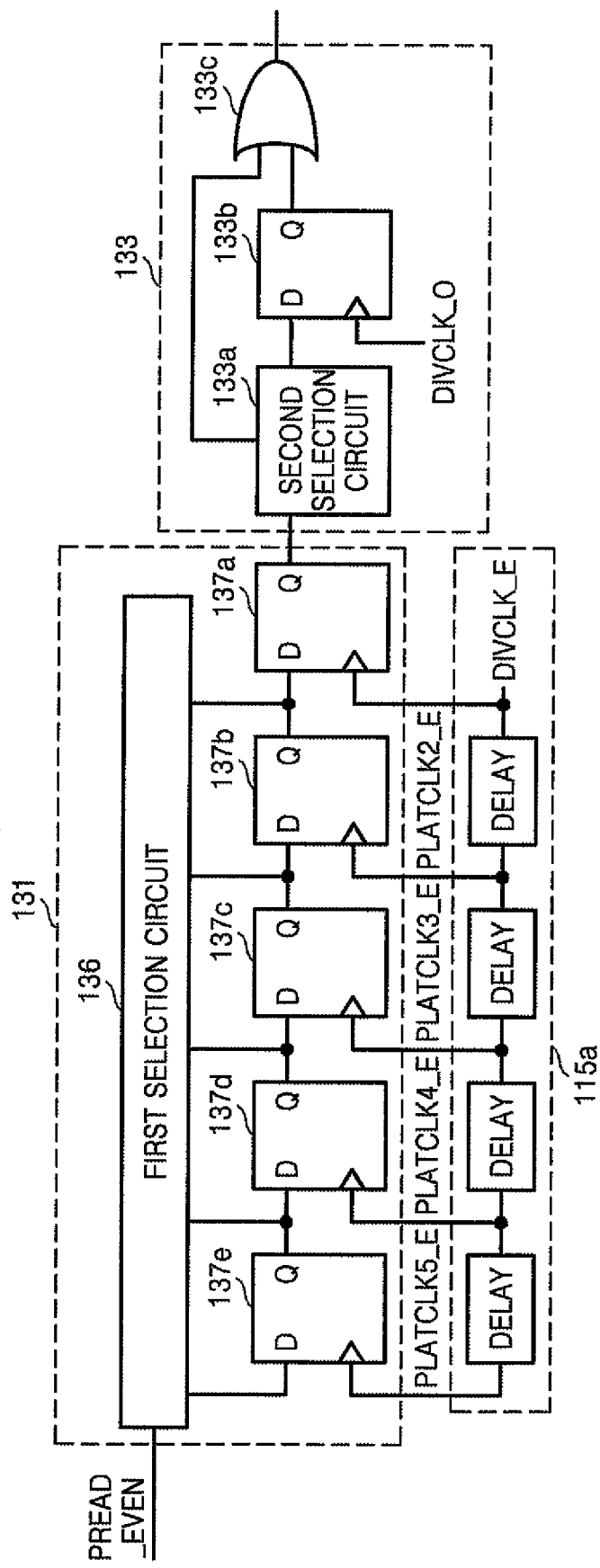
FIG. 4 is a circuit diagram of an example of a clock delay block and a latency signal generation unit in the example of FIG. 3.

FIG. 4 is a circuit diagram illustrating an example of clock delay block 115*a* and latency signal generation units 131 and 133 of FIG. 3. For simplicity, FIG. 4 shows only first clock delay block 115*a*, and first shift register unit 131 and first latency control unit 133 for shifting even internal read command PREAD_EVEN.

Referring to FIG. 4, first clock delay block 115*a* comprises a plurality of delay elements DELAY for receiving and delaying even divided signal DIVCLK_E. First shift register unit 131 comprises first selection circuit 136 and a plurality of shift registers 137*a*-137*e*. First selection circuit 136 receives even internal read command PREAD_EVEN, and outputs the received even internal read command PREAD_EVEN to a corresponding one of shift registers 137*a*-137*e*.

Each of shift registers 137*a*-137*e* shifts even internal read command PREAD_EVEN or the output signal of the front-end shift register in response to a corresponding one of first control clocks PLATCLK[1:n]. First latency control unit 133 receives the output signal of first shift register unit 131, and delays and outputs the input signal by one cycle of external clock CLK if a predetermined condition is met. For example, where the latency set value is an odd multiple of external clock CLK, first latency control unit 133 delays and outputs the output signal of first shift register unit 131 by one cycle of external clock CLK. Also, where the latency set value is an even multiple of external clock CLK, first latency control unit 133 outputs the output signal of first shift register unit 131 without delay. This is because first shift register unit 131 performs a shifting operation based on first control clocks PLATCLK[1:n] having a period that is twice that of external clock CLK.

First latency control unit 133 comprises a second selection circuit 133*a*, a shift register 133*b*, and a logical device 133*c*. Second selection circuit 133*a* determines whether to delay the output signal of first shift register unit 131 by one clock of external clock CLK. Second selection circuit 133*a* can comprise, for instance, a switch to selectively output the output signal of first shift register unit 131 to shift register 133*b* or logical device 133*c*.

Shift register 133*b* delays and outputs the output signal of first shift register unit 131 by one clock of external clock CLK. Logical device 133*c* selectively outputs the output signal of first shift register unit 131 or the output signal of shift register 133*b*, as latency signal LATENCY. Logical device 133*c* can comprise, for instance, an OR gate for selectively outputting the output signal of first shift register unit 131 or the output signal of shift register 133*b*.

Figure 5:
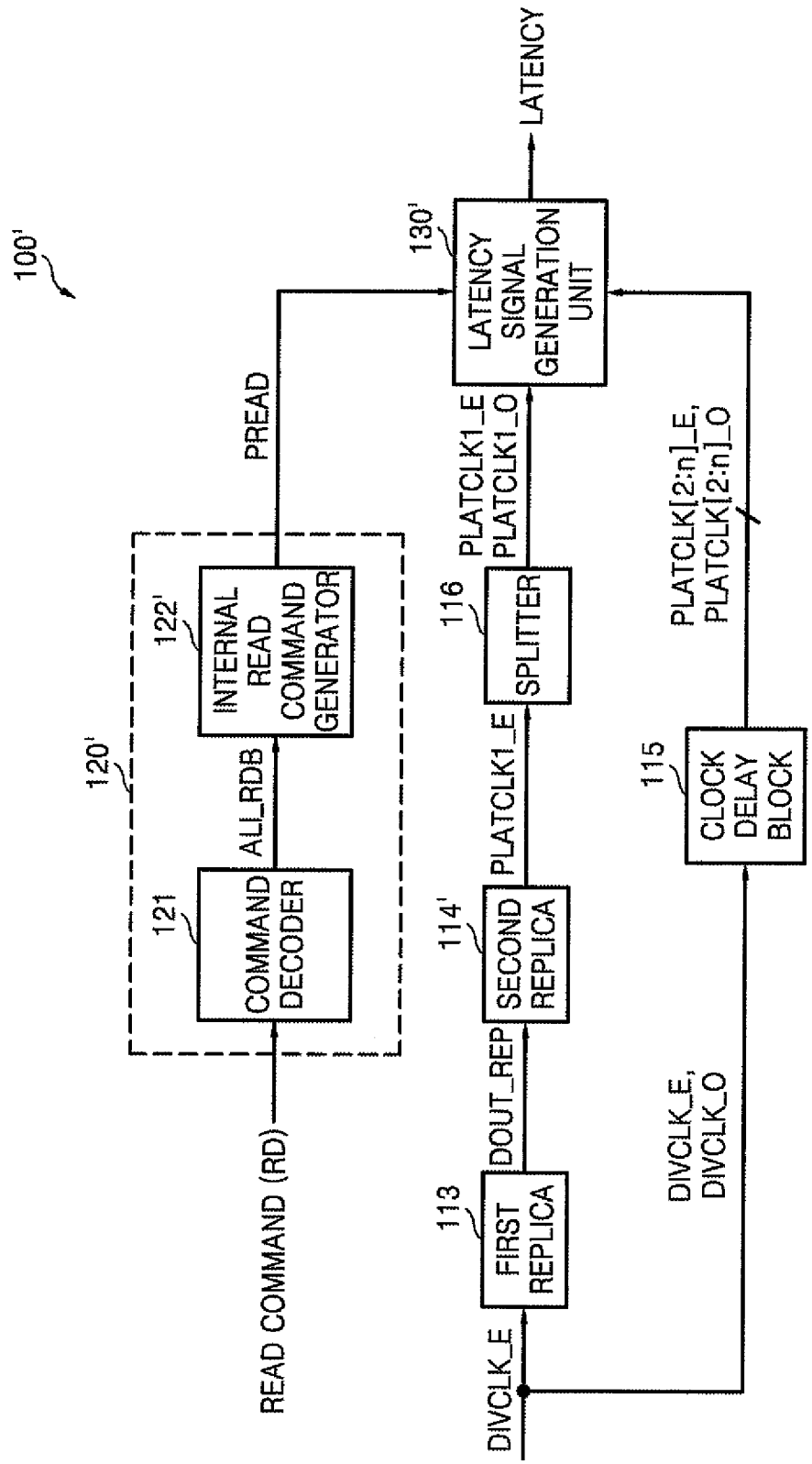
FIG. 5 is a block diagram of a latency circuit that is presented for comparison with the latency circuit of FIG. 1.
Figure 6:
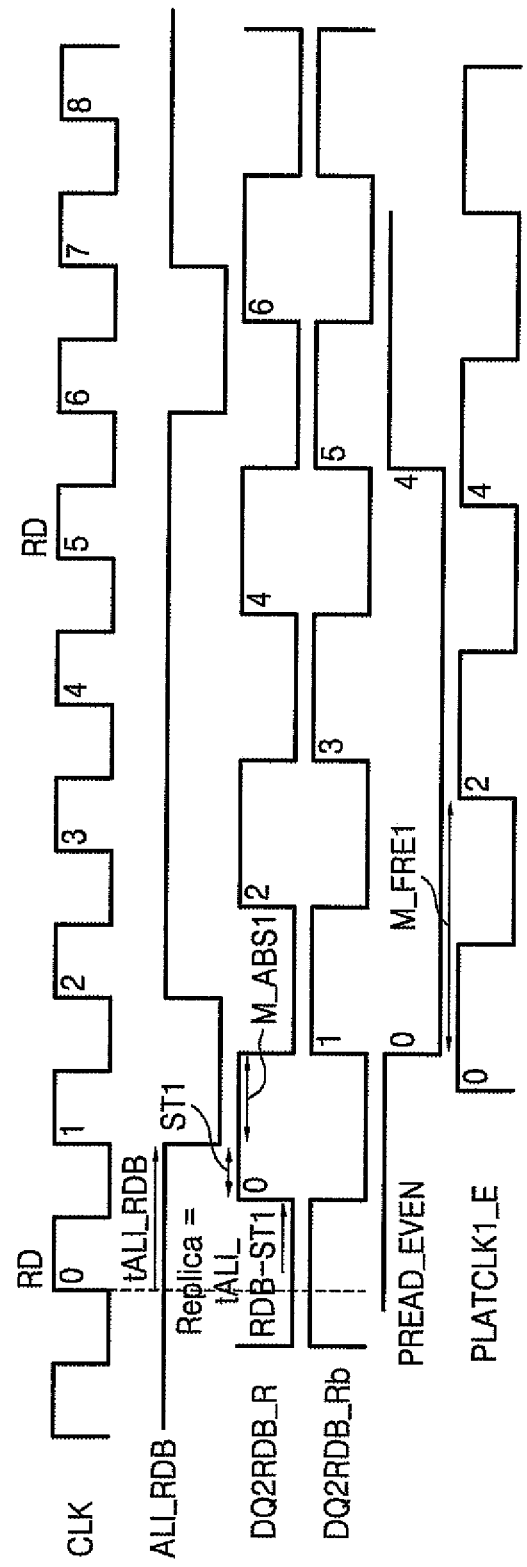
FIG. 6 is a timing diagram for explaining the operation of the latency circuit of FIG. 1.
Figure 7:
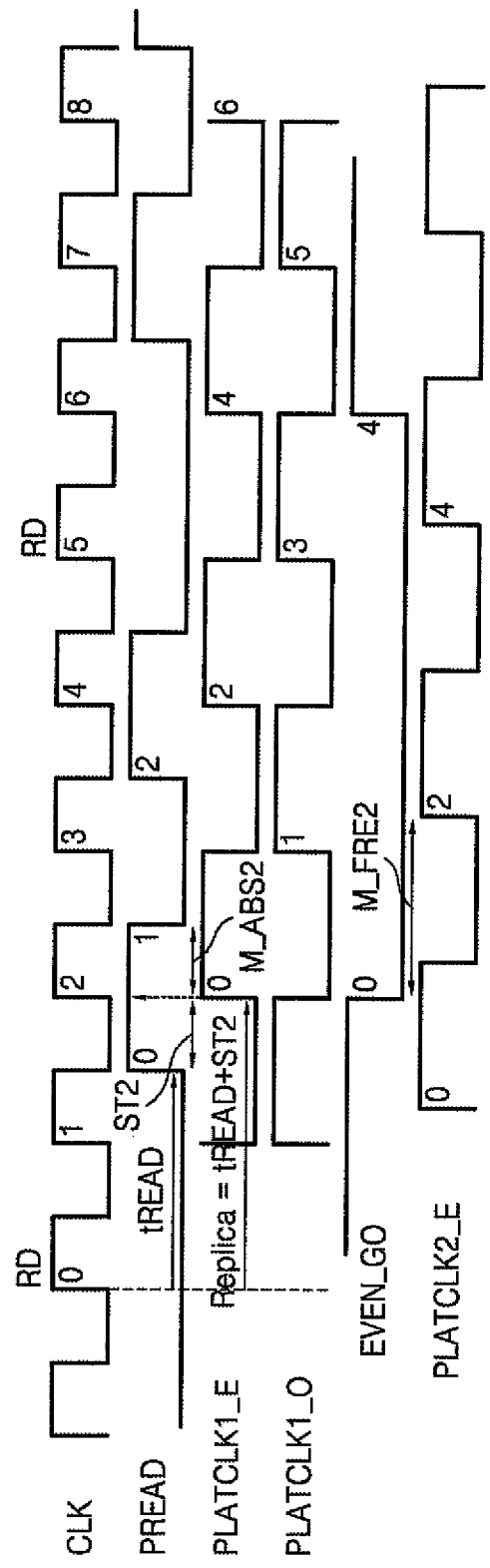
FIG. 7 is a timing diagram for explaining the operation of the latency circuit of FIG. 5.

FIG. 5 is a block diagram of a latency circuit 100', which is presented for comparison with latency circuit 100 of FIG. 1. Latency circuit 100' produces latency signal LATENCY using a different method from that used for latency circuit 100. FIGS. 6 and 7 are timing diagrams for explaining the operation of latency circuit 100 of FIG. 1 and latency circuit 100', respectively.

Latency circuit 100 of FIG. 1 and latency circuit 100' of FIG. 5 differ in the way they change signals from one timing domain to another, which is referred to as a domain change method. In latency circuit 100 of FIG. 1, a domain change is generated by using internal read command generator 122 to latch second control clock DQ2RDB_R, which belongs to the domain of delay sync signal PDLLO, according to decoded read command ALI_RDB, which belongs to the domain of external clock CLK. On the other hand, in latency circuit 100' of FIG. 5, a domain change is generated by using a latency signal generation unit 130' to latch internal read command PREAD, which belongs to the domain of external clock CLK, using control clocks PLATCLK1 and PLATCLK[2:n], which belong to the domain of delayed sync signal PDLLO.

Latency circuit 100' comprises elements 113, 115 and 121, which are substantially the same as elements 113, 115 and 121 in latency circuit 100. Latency circuit 100' further comprises a second replica 114', a splitter 116, an internal read command generation unit 120', and a latency signal generation unit 130'. Certain differences between latency circuit 100' of FIG. 5 and latency circuit 100 of FIG. 1 will be described below with reference to FIGS. 1-6.

Second replica 114 of FIG. 1 receives a clock DOUT_REP output from first replica 113, and generates second control clock DQ2RDB_R by delaying the clock DOUT_REP based on the phase difference between external clock CLK and decoded read command ALI_RDB. However, second replica 114' of FIG. 5 receives a clock DOUT_REP output from first replica 113, and generates an even control clock PLATCLK1_E by delaying the clock DOUT_REP based on the phase difference between external clock CLK and the internal read command PREAD.

Splitter 116 of FIG. 5 generates an odd control clock PLATCLK1_O based on even control clock PLATCLK1_E output from second replica 114', and outputs even control clock PLATCLK1_E and odd control clock PLATCLK1_O to latency signal generation unit 130'. Latency circuit 100 of FIG. 1 does not include splitter 116 such as that included in latency circuit 100' of FIG. 5.

Internal read command generator 122 of FIG. 1 receives decoded read command ALI_RDB and second control clock DQ2RDB_R, and samples second control clock DQ2RDB_R using decoded read command ALI_RDB to generate internal read commands PREAD_EVEN and PREAD_ODD. Accordingly, a domain change is generated in internal read command generator 122 of FIG. 1, whereas no domain change is generated in internal read command generator 122' of FIG. 5.

Latency signal generation unit 130 of FIG. 1 generates latency signal LATENCY by latching internal read commands PREAD_EVEN and PREAD_ODD using first control clocks PLATCLK[1:n] output from clock delay block 115. However, latency signal generation unit 130' of FIG. 5 generates latency signal LATENCY by latching internal read commands PREAD_EVEN and PREAD_ODD based on control clocks PLATCLK1_E and PLATCLK1_O output from splitter 116 and control clocks PLATCLK[2:n]_E and PLATCLK[2:n]_E output from clock delay block 115. That is, a domain change is generated in latency signal generation unit 130' of FIG. 5, whereas no domain change is generated in latency signal generation unit 130 of FIG. 1.

Certain differences between latency circuit 100 of FIG. 1 and latency circuit 100' of FIG. 5, and certain consequences of these differences, are briefly described below.

First, because a domain change in latency circuit 100 is generated by latching second control clock DQ2RDB_R to generate internal read commands PREAD_EVEN and PREAD_ODD, the amount of delay in second replica 114 is reduced compared to second replica 114' of latency circuit 100'.

Referring to FIGS. 6 and 7, the delay of control clock PLATCLK1_E input to latency signal generation unit 130' of FIG. 5 is a sum of time tREAD for generating internal read commands PREAD_EVEN and PREAD_ODD, and setup time ST2 of latency signal generation unit 130'. On the other hand, the delay of control clock DQ2RDB_R input to latency signal generation unit 130 of FIG. 1 is obtained by subtracting setup time ST1 at internal read command generator 122 from time tALI_RDB used to generate decoded read command ALI_RDB, which is generated before internal read command PREAD. These different delays exist because decoded read command ALI_RDB functions as a clock, and control clock DQ2RDB_R works as latched data during the latching operation of internal read command generator 122 in latency circuit 100 of FIG. 1.

Because of the smaller delay in second replica 114, a smaller number of gates are required in second replica 114. Consequently, the current consumption of second replica 114 is decreased, and the design of a latency circuit is more tolerant to variations in PVT. For instance, as the delay of second replica 114 decreases, variations in delay due to PVT decrease accordingly, so the amount of change in an absolute margin M_ABS1 according to PVT variations in second replica 114 is smaller than the amount of a change in an absolute margin M_ABS2 according to PVT variations in second replica 114'. As a result, latency circuit 100 of FIG. 1 generates latency signal LATENCY more stably than latency circuit 100' in the presence of PVT variations.

Second, because the domain change in latency circuit 100 is performed by internal read command generator 122, splitter 116, which is used in latency circuit 100' to generate clock PLATCLK1_O for latency signal generation unit 130', is not required in latency circuit 100. Thus, the current consumption of latency circuit 100 is reduced relative to latency circuit 100'.

Third, because, unlike latency circuit 100', latency circuit 100 does not use control clocks PLATCLK1_E and PLATCLK1_O, the frequency margin of the control clock in latency circuit 100 is greater than the frequency margin of the control clock of latency circuit 100'. For instance, referring to FIGS. 6 and 7, frequency margin M_FRE1 of the control clock of latency circuit 100 is greater than the frequency margin M_FRE2 of the control clock of latency circuit 100'. Frequency margin M_FRE1 of the control clock of latency circuit 100 is obtained based on the latching time point of control clock PLATCLK1_E to even internal read command PREAD_EVEN. Frequency margin M_FRE2 of the control clock of latency circuit 100' is obtained based on the difference in the latching time point between control clocks PLATCLK1_E and PLATCLK2_E to internal read command PREAD.

As indicated by the foregoing, because latency circuit 100 changes the position of the domain change to internal read command generator 122 and reduces the delay amount of second replica 114, the absolute margin during the domain change is improved and the frequency margin of the control clock is improved so that latency signal LATENCY is more stably generated in spite of PVT variations. Furthermore, the structure of a latency circuit 100 is simplified and current consumption is reduced relative to latency circuit 100'.

Table 1 shows a change in the delay amount of the second replica, a change in the absolute margin during the domain change, and a change in the frequency margin of the control clock according to a predetermined PVT change in latency circuit and latency circuit 100'.

TABLE 1

|  | Latency Circuit 100' | Latency Circuit 100 |
| --- | --- | --- |
| Change in Delay Amount of Second Replica | 1.91 nsec → 0.86 nsec | 0.40 nsec → 0.18 nsec |
| Absolute Margin during Domain Change | 0.56 nsec → 0.21 nsec | 0.56 nsec → 0.31 nsec |
| Frequency Margin of Control Clock | 0.09 nsec → 0.41 nsec | 0.39 nsec → 0.53 nsec |

As indicated by Table 1, in latency circuit 100 of FIG. 1, the change in the delay amount of the second replica is smaller than that of latency circuit 100', and the absolute margin during the domain change and the frequency margin of the control clock are improved compared to latency circuit 100'.

Table 2 shows the current consumption according to the frequency of latency circuit 100 and latency circuit 100'.

TABLE 2

|  | Latency Circuit 100' | Latency Circuit 100 | Reduction Amount |
| --- | --- | --- | --- |
| First Frequency | 1.22 mA | 0.8 mA | 420 μA |
| Second Frequency | 1.89 mA | 1.28 mA | 610 μA |

As indicated by Table 2, latency circuit 100 consumes 420 μA less current than latency circuit 100' at a first frequency, and 610 μA less current than latency circuit 100' at a second frequency that is higher than the first frequency.

In certain embodiments, latency circuit 100 can be used to generate a latency signal in a semiconductor device such as a random access memory (RAM). For instance, latency circuit 100 can be used to set a number of clock cycles that should pass between application of a read command by a memory controller of a synchronous semiconductor memory device, and availability of corresponding output data.

Figure 8:
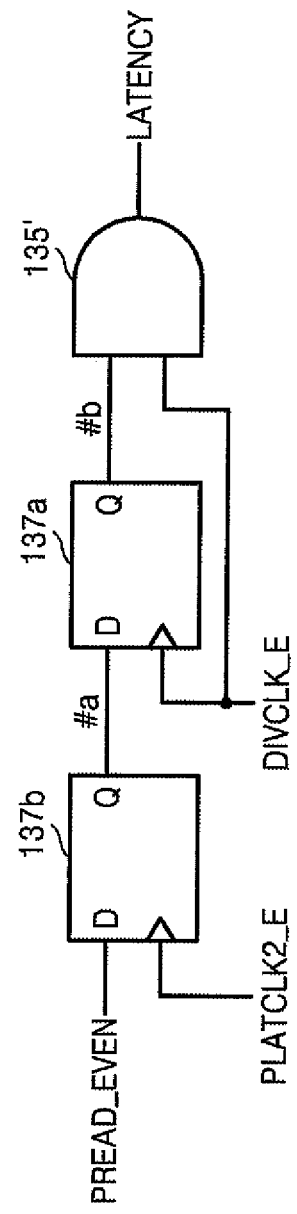
FIG. 8 is a circuit diagram of a latency signal generation unit of the latency circuit of FIG. 1.
Figure 9:
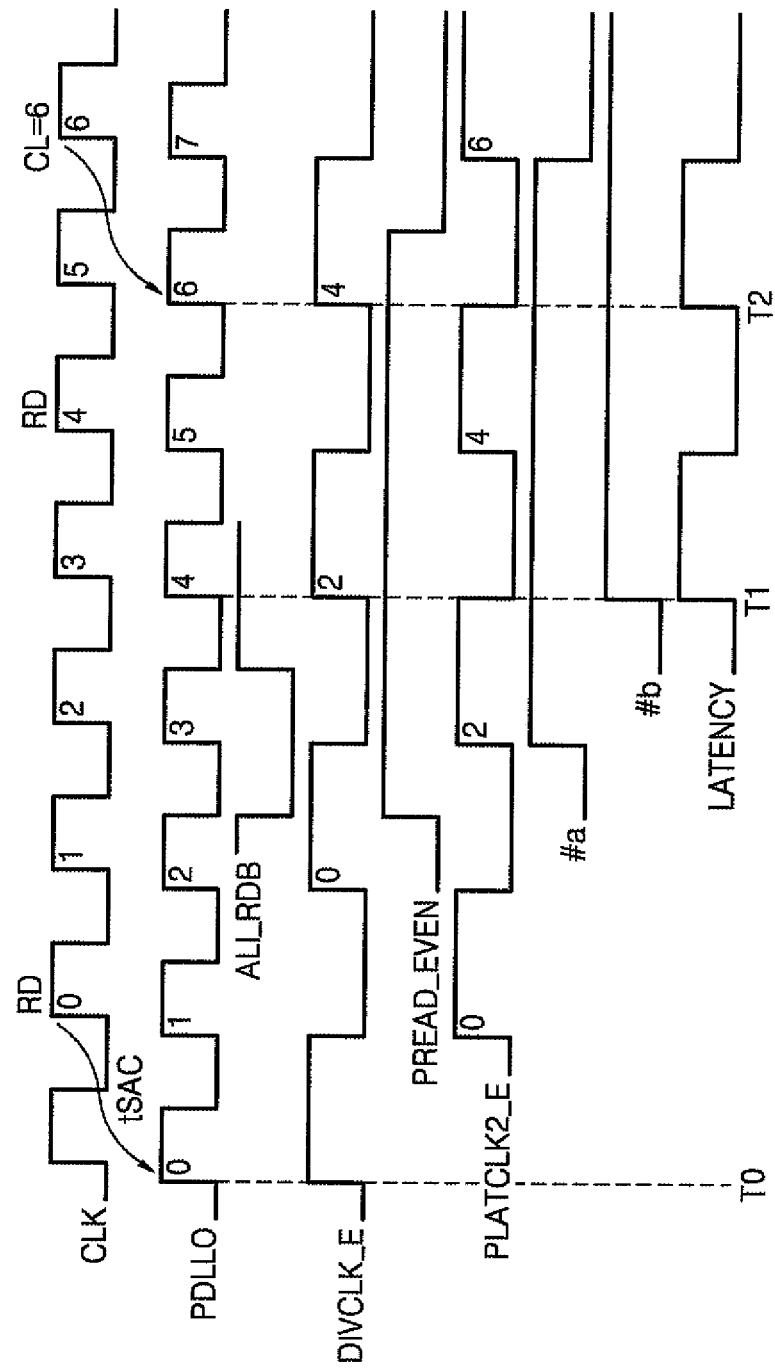
FIG. 9 is a timing diagram for explaining the operation of the latency signal generation unit of FIG. 8.

FIG. 8 is a circuit diagram of an embodiment of latency signal generation unit 130 of latency circuit 100, and FIG. 9 is a timing diagram for explaining the operation of latency signal generation unit 130 of FIG. 8. In the description that follows, the operation of latency signal generation unit 130 will be described below for an example where the latency is set to 6 (CL=6).

Delay sync loop 111 receives external clock CLK and generates delay sync signal PDLLO having a phase that leads the phase of external clock CLK by a predetermined time tSAC. Clock divider 112 receives delay sync signal PDLLO and generates even divided signal DIVCLK_E by dividing the received delay sync signal PDLLO into two. Command decoder 121 receives and decodes read command RD and generates decoded read command ALI_RDB. Internal read command generator 122 generates even read command PREAD_EVEN based on decoded read command ALI_RDB.

Then, shift register 137b of latency signal generation unit 130 receives even control clock PLATCLK2_E and even read command PREAD_EVEN output from clock delay block 115, and shifts even read command PREAD_EVEN in response to even control clock PLATCLK2_E and outputs a result of the shifting, which is a signal #a of FIG. 8. Shift register 137a of latency signal generation unit 130 receives even divided signal DIVCLK_E output from block delay block 115 and output signal #a of shift register 137b, and shifts output signal #a of shift register 137b in response to even divided signal DIVCLK_E and outputs a result of the shifting, which is a signal #b of FIG. 8.

A logical device 135' of latency signal generation unit 130 generates latency signal LATENCY by performing an AND operation on output signal #b of shift register 137a and even divided signal DIVCLK_E. Latency signal LATENCY is activated at a time point T1 that is 4 clock cycles after a time point T0 when read command RD is input. Then, a block for outputting effective data (not shown) controls latency signal LATENCY so that the effective data is output at a time point T2 that is 6 clock cycles after time point T0.

Figure 10:
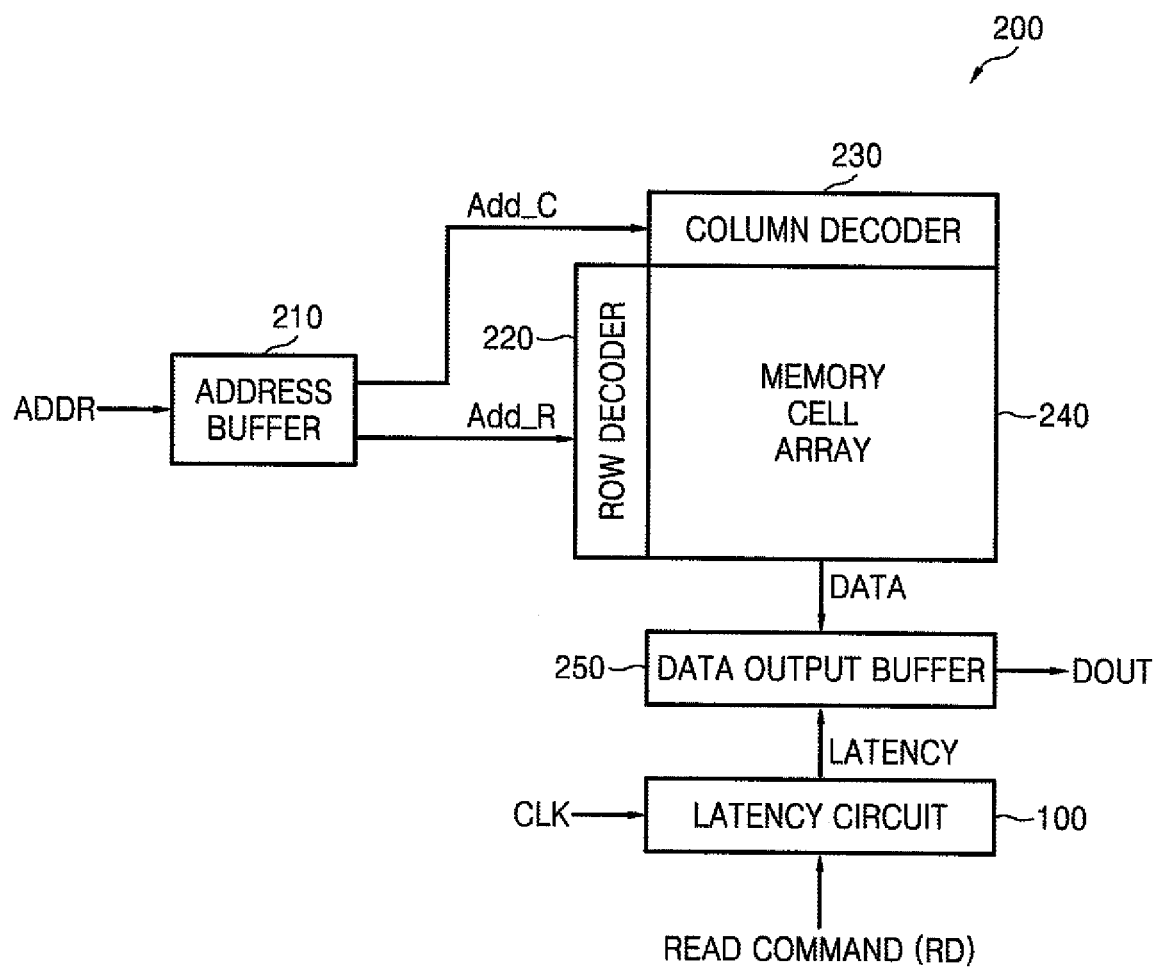
FIG. 10 is a block diagram of a semiconductor memory device incorporating the latency circuit of FIG. 1 according to an embodiment of the inventive concept.

FIG. 10 is a block diagram of a semiconductor memory device 200 according to an embodiment of the inventive concept. Referring to FIG. 10, semiconductor memory device 200 comprises latency circuit 100 for generating latency signal LATENCY based on external clock CLK and read command RD, an address buffer 210 for receiving an address ADDRESS and outputting a row address signal Add_R and a column address signal Add_C, a row decoder 220, a column decoder 230, a memory cell array 240 for outputting stored data DATA, and a data output buffer 250. The time point to output effective data DOUT from data output buffer 250 is determined based on latency signal LATENCY.

In various embodiments, latency circuit 100 and/or semiconductor memory device 200 can be packed in various types of packages. These packages can have any of several configurations, such as package on package (PoP), ball grid array (BGA), chip scale package (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flatpack (TQFP), small outline (SOIC), shrink small outline package (SSOP), thin small outline (TSOP), thin quad flatpack (TQFP), system in package (SIP), multi chip package (MCP), wafer-level fabricated package (WFP), wafer-level processed stack package (WSP).

Various embodiments of the inventive concept can be implemented in hardware, software, firmware, or combinations thereof. In embodiments comprising software or firmware, code, programs, and/or data can be stored on various types of computer readable storage media. Examples of such media include read-only memory (ROM), random-access memory (RAM), electrically erasable programmable ROM (EEPROM), and flash memory.

As indicated by the foregoing, in a latency circuit or a semiconductor memory device including the latency circuit according to certain embodiments of the inventive concept, a latency signal can be stably generated even when the frequency of an external clock increases. Also, the latency circuit and the semiconductor memory device can stably generate a latency signal in spite PVT variations.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A latency circuit, comprising:
   a latency control block that generates a plurality of first control clocks by delaying a delay sync signal generated based on an external clock, and generates a second control clock having a predetermined margin with respect to a read command decoded based on the delay sync signal;
   an internal read command generator that samples the second control clock using the decoded read command and generates an internal read command based on a sampled second control clock; and
   a latency signal generation unit that generates a latency signal based on a shifting operation performed on the internal read command using the plurality of first control clocks,
   wherein the latency control block generates the second control clock by delaying the delay sync signal using a first replica corresponding to a data output path and a second replica corresponding to a path through which the decoded read command is generated.

2. The latency circuit of claim 1, wherein the latency control block comprises:
   a first replica that receives the delay sync signal and generates a third clock in synchronization with the external clock by delaying the delay sync signal by a delay corresponding to a data output path;
   a second replica that receives the third clock and generates the second control clock by delaying the third clock based on a phase difference between the external clock and the decoded read command; and
   a clock delay block that receives the delay sync signal and generates the plurality of first control clocks by delaying the delay sync signal.

3. The latency circuit of claim 2, wherein the second replica delays the third clock for an interval equal to a difference between a phase difference between the external clock and the decoded read command and a sampling setup time of the second control clock of the internal read command generator.

4. The latency circuit of claim 1, wherein the internal read command generator comprises:
   a sampling block that samples the second control clock based on the decoded read command;
   a command delay block that generates a plurality of delayed read commands by delaying the decoded read command; and
   a logical operation block that generates the internal read command by performing a logical operation on the sampled second control clock and the plurality of delayed read commands.

5. The latency circuit of claim 1, wherein the latency signal generation unit comprises:
   a shift register unit that performs a shifting operation on the internal read command based on the plurality of first control clocks; and a latency control unit that selectively performs an additional shifting operation on a signal output from the shift register unit based on a latency setting value.

6. The latency circuit of claim 1, wherein the latency signal indicates availability of data output in response to the read command.

7. The latency circuit of claim 1, wherein the read command is used to read data in a random access memory.

8. A semiconductor memory device comprising:
- a memory cell array comprising a plurality of memory cells;
- a data output buffer that receives output data from the memory cell array; and
- a latency circuit that generates a latency signal for the data output buffer, the latency circuit comprising:
- a latency control block that generates a plurality of first control clocks by delaying a delay sync signal generated based on an external clock, and generates a second control clock having a predetermined margin with respect to a read command decoded based on the delay sync signal;
- an internal read command generator that samples the second control clock using the decoded read command and generates an internal read command based on a sampled second control clock; and
- a latency signal generation unit that generates the latency signal based on a shifting operation performed on the internal read command using the plurality of first control clocks,
- wherein the latency control block generates the second control clock by delaying the delay sync signal using a first replica corresponding to a data output path and a second replica corresponding to a path through which the decoded read command is generated.

9. The semiconductor device of claim 8, wherein the memory cell array forms part of a random access memory.

10. The semiconductor device of claim 8, wherein the memory cell array and the latency circuit are packaged in a semiconductor package having a configuration selected from a package on package configuration, ball grid array configuration, and a chip scale package configuration.

11. A semiconductor memory device comprising:
- a memory cell array comprising a plurality of memory cells;
- a data output buffer that receives output data from the memory cell array; and
- a latency circuit that generates a latency signal for the data output buffer, the latency circuit comprising:
- a latency control block that generates a plurality of first control clocks by delaying a delay sync signal generated based on an external clock, and generates a second control clock having a predetermined margin with respect to a read command decoded based on the delay sync signal;
- an internal read command generator that samples the second control clock using the decoded read command and generates an internal read command based on a sampled second control clock; and
- a latency signal generation unit that generates the latency signal based on a shifting operation performed on the internal read command using the plurality of first control clocks,
- wherein the latency signal generation unit comprises:
- a shift register unit that performs a shifting operation on the internal read command based on the plurality of first control clocks; and
- a latency control unit that selectively performs an additional shifting operation on a signal output from the shift register unit based on a latency setting value.

* * * * *